(12) United States Patent
Epureanu et al.

(10) Patent No.: US 12,399,227 B2
(45) Date of Patent: Aug. 26, 2025

(54) ACOUSTIC WAVE-BASED BATTERY MANAGEMENT

(71) Applicant: The Regents of the University of Michigan, Ann Arbor, MI (US)

(72) Inventors: Bogdan I. Epureanu, Ann Arbor, MI (US); Ganghyeok Im, Ann Arbor, MI (US); Wei Lu, Northville, MI (US); Bogdan Ioan Popa, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 694 days.

(21) Appl. No.: 17/677,627

(22) Filed: Feb. 22, 2022

(65) Prior Publication Data
US 2022/0268851 A1   Aug. 25, 2022

Related U.S. Application Data

(60) Provisional application No. 63/152,027, filed on Feb. 22, 2021.

(51) Int. Cl.
*G01R 31/392* (2019.01)
*G01N 29/02* (2006.01)
*G01R 31/385* (2019.01)

(52) U.S. Cl.
CPC ......... *G01R 31/392* (2019.01); *G01N 29/02* (2013.01); *G01R 31/385* (2019.01)

(58) Field of Classification Search
CPC .... G01R 31/392; G01R 31/385; G01N 29/02; H01M 4/13; H01M 10/0413; H01M 10/0431; H01M 10/0525; H01M 10/0587; H01M 10/44; H01M 50/211; H01M 50/249; H01M 50/70; H01M 2220/20
See application file for complete search history.

(56) References Cited

FOREIGN PATENT DOCUMENTS

CN   109817987 A  *  5/2019
TW   201728505 A  *  8/2017  ............... B08B 3/12

OTHER PUBLICATIONS

English machine translation of CN 109817987 A (Year: 2019).*
English machine translation of TW 201728505 A (Year: 2017).*
Agostini, M. et al.; A high-power and fast charging Li-ion battery with outstanding cycle-life; Sci. Rep. vol. 7, 2017; pp. 1-7.
Agubra, V. A. et al; Analysis of effects of the state of charge on the formation and growth of the deposit layer on graphite electrode of pouch type lithium ion polymer batteries; J. Power Sources vol. 270, 2014; pp. 213-220.

(Continued)

*Primary Examiner* — Walter L Lindsay, Jr.
*Assistant Examiner* — Geoffrey T Evans
(74) *Attorney, Agent, or Firm* — Lempia Summerfield Katz LLC (57) ABSTRACT

A battery cell in which a liquid electrolyte is disposed and an acoustic transducer in mechanical communication with the battery cell. The acoustic transducer is configured to generate acoustic waves. The acoustic waves have a wavelength larger than a dimension of the battery cell such that the acoustic waves generate cavitation bubbles in the electrolyte.

19 Claims, 8 Drawing Sheets

(56) References Cited

OTHER PUBLICATIONS

An, S. J. et al.; The state of understanding of the lithium-ion-battery graphite solid electrolyte interphase (SEI) and its relationship to formation cycling; Carbon vol. 105, 2016; pp. 52-76.

Andre, D. et al.; Characterization of high-power lithium-ion batteries by electrochemical impedance spectroscopy. I. Experimental investigation; J. Power Sources vol. 196, 2011; pp. 5334-5341.

Arora, P. et al.; Capacity Fade Mechanisms and Side Reactions in Lithium-Ion Batteries; J. Electrochem. Soc. vol. 145, 1998; pp. 3647-3667.

Aurbach, D.; Review of selected electrode-solution interactions which determine the performance of Li and Li ion batteries; J. Power Sources vol. 89, 2000; pp. 206-218.

Birkl CR et al., Degradation diagnostics for lithium ion cells, Journal of Power Sources, vol. 341, Feb. 15, 2017, pp. 373-386.

Brotchie, A. et al.; Effect of power and frequency on bubble-size distributions in acoustic cavitation; Phys. Rev. Lett. vol. 102, 2009; pp. 1-4.

Chahine, G. L. et al.; Modeling of surface cleaning by cavitation bubble dynamics and collapse; Ultrason. Sonochem. vol. 29, 2016; pp. 528-549.

Christensen, J. et al.; Effect of Anode Film Resistance on the Charge/Discharge Capacity of a Lithium-Ion Battery; J. Electrochem. Soc. vol. 150, 2003; pp. A1416-A1420.

Compton, R. G. et al.; Dual activation: Coupling ultrasound to electrochemistry—An overview; Electrochim. Acta vol. 42, 1997; pp. 2919-2927.

Crum, L. A. et al.; Acoustic cavitation generated by microsecond pulses of ultrasound; Nature vol. 319, 1986; pp. 52-54.

Ding, F. et al.; Effects of ultrasound on lithium metal rechargeable battery characteristics at high charging rate; Electrochem. commun. vol. 7, 2005; pp. 552-556.

Dornbusch, D. A. et al.; Effects of sonication on eis results for zinc alkaline batteries; ECS Electrochem. Lett. vol. 2, 2013; pp. A89-A92.

Edström, K. et al.; A new look at the solid electrolyte interphase on graphite anodes in Li-ion batteries; J. Power Sources vol. 153, 2006; pp. 380-384.

Goodenough, J. B. et al.; Challenges for rechargeable batteries; J. Power Sources vol. 196, 2011; pp. 6688-6694.

Han, X. et al.; A review on the key issues of the lithium ion battery degradation among the whole life cycle; eTransportation vol. 1, 2019; pp. 1-21.

Hilton, R. et al.; Ultrasonic enhancement of battery diffusion; Ultrason. Sonochem. vol. 21, 2014; pp. 901-907.

Huang An et al.; Enabling Rapid Charging Lithium Metal Batteries via Surface Acoustic Wave-Driven Electrolyte Flow; Adv. Mater. vol. 32, 2020; pp. 1-7.

Huang, Q. A. et al.; Impedance Characteristics and Diagnoses of Automotive Lithium-Ion Batteries at 7.5% to 93.0% State of Charge; Electrochim. Acta vol. 219, 2016; pp. 1-53.

J. Vetter et al., Ageing mechanisms in lithium-ion batteries, Journal of Power Sources, vol. 147, Issues 1-2, Sep. 9, 2005, pp. 269-281.

Jamshidi, R.; Modeling and Numerical Investigation of Acoustic Cavitation with Applications in Sonochemistry; Dissertation—Doctoral Thesis; Universitätsbibliothek Clausthal; 2013; pp. 1-159.

Jespersen, J. L. et al.; Capacity Measurements of Li-Ion Batteries using AC Impedance Spectroscopy; World Electric Vehicle Journal vol. 3; 2009; pp. 127-133.

Jossen, A.; Fundamentals of battery dynamics; J. Power Sources vol. 154, 2006; pp. 530-538.

Koltypin, M. et al.; The study of lithium insertion-deinsertion processes into composite graphite electrodes by in situ atomic force microscopy (AFM); Electrochem. commun. vol. 4, 2002; pp. 17-23.

Lauterborn, W. et al.; Experimental investigations of cavitation-bubble collapse in the neighbourhood of a solid boundary; J. Fluid Mech. vol. 72, 1975; pp. 391-399.

Lee, J. et al.; Determination of the size distribution of sonoluminescence bubbles in a pulsed acoustic field; J. Am. Chem. Soc. vol. 127, 2005; pp. 16810-16811.

Legay, M. et al.; Enhancement of heat transfer by ultrasound: Review and recent advances; Int. J. Chem. Eng. vol. 2011, 2011; pp. 1-17.

Li, S. E. et al.; An electrochemistry-based impedance model for lithium-ion batteries; J. Power Sources vol. 258, 2014; pp. 9-18.

Lu, P. et al.; Chemistry, impedance, and morphology evolution in solid electrolyte interphase films during formation in lithium ion batteries; J. Phys. Chem. C vol. 118, 2014; pp. 896-903.

Mizushima, K. et al.; $Li_xCoO_2$ ($0x\cdot 1$): A new cathode material for batteries of high energy density; Solid State Ionics vol. 3-4, 1981; pp. 171-174.

Momma, T. et al.; Ac impedance analysis of lithium ion battery under temperature control. J. Power Sources vol. 216, 2012; pp. 304-307.

Ning, G. et al.; Cycle Life Modeling of Lithium-Ion Batteries; J. Electrochem. Soc. vol. 151, 2004; pp. A1584-A1591.

Plesset, M. S. et al.; Collapse of an initially spherical vapour cavity in the neighbourhood of a solid boundary; J. Fluid Mech. vol. 47,1971; pp. 283-290.

Reichert, M. et al.; Influence of relaxation time on the lifetime of commercial lithium-ion cells; J. Power Sources vol. 239, 2013; pp. 45-53.

Rieger, B. et al.; Multi-scale investigation of thickness changes in a commercial pouch type lithium-ion battery; J. Energy Storage vol. 6, 2016; pp. 213-221.

Suresh, P. et al.; Temperature dependence studies of a.c. impedance of lithium-ion cells; J. Appl. Electrochem. vol. 32, 2002; pp. 267-273.

Tarascon, J. M. et al.; Issues and challenges facing rechargeable lithium batteries; Nature; vol. 414, 2001; pp. 359-367.

Thomas, M. G. S. R. et al.; AC Impedance Analysis of Polycrystalline Insertion Electrodes: Application to $Li1-xCoO_2$; J. Electrochem. Soc. vol. 132, 1985; pp. 1521-1528.

Tsang, K. M. et al.; Identification and modelling of Lithium ion battery; Energy Convers. Manag. vol. 51, 2010; pp. 2857-2862.

University of California—San Diego; "Ultrasound device improves charge time and run time in lithium batteries: The device brings lithium metal batteries one step closer to commercial viability." ScienceDaily; Feb. 18, 2020; pp. 1-4.

Verma, P. et al.; A review of the features and analyses of the solid electrolyte interphase in Li-ion batteries; Electrochim. Acta vol. 55, 2010; pp. 6332-6341.

W. Lauterborn et al.; Experimental and theoretical bubble dynamics; Adv. Chem. Phys. vol. 110, 1999; pp. 295-380.

Xu, K.; Electrolytes and interphases in Li-ion batteries and beyond; Chem. Rev. vol. 114, 2014; pp. 11503-11618.

Yasui, K.; Influence of ultrasonic frequency on multibubble sonoluminescence; J. Acoust. Soc. Am. vol. 112, 2002; pp. 1405-1413.

Yoshino, A.; Chapter 1: Development of the Lithium-Ion Battery and Recent Technological Trends; Lithium-Ion Batteries: Advances and Applications; Elsevier Science and Technology Books; 2014; pp. 1-20.

Zhang, S. S.; The effect of the charging protocol on the cycle life of a Li-ion battery; J. Power Sources vol. 161, 2006; pp. 1385-1391.

Zheng, J. et al. Electrolyte additive enabled fast charging and stable cycling lithium metal batteries; Nat. Energy vol. 2, 2017; pp. 1-8.

Zhu, G. L. et al.; Fast Charging Lithium Batteries: Recent Progress and Future Prospects; Small vol. 15, 2019; pp. 1-14.

Zubi, G. et al.; The lithium-ion battery: State of the art and future perspectives; Renew. Sustain. Energy Rev. vol. 89, 2018; pp. 292-308.

* cited by examiner

FIG. 8

ACOUSTIC WAVE-BASED BATTERY MANAGEMENT

CROSS-REFERENCE TO RELATED APPLICATION

This application claims the benefit of U.S. provisional application entitled "Acoustic Wave-Based Battery Management," filed Feb. 22, 2021, and assigned Ser. No. 63/152,027, the entire disclosure of which is hereby expressly incorporated by reference.

STATEMENT REGARDING FEDERALLY SPONSORED RESEARCH OR DEVELOPMENT

This invention was made with support of the Automotive Research Center (ARC) in accordance with Cooperative Agreement W56HZV-19-2-0001 U.S. Army DEVCOM Ground Vehicle Systems Center (GVSC) Warren, MI The government has certain rights in the invention.

BACKGROUND OF THE DISCLOSURE

Field of the Disclosure

The disclosure relates generally to charging and health management of batteries.

Brief Description of Related Technology

At present, Lithium-ion batteries (LIBs) are the most widely used energy source and storage devices today due to their high energy density, no memory effect, and low self-discharge properties. LIBs can be found in all aspects of our lives, from cell phones to electric vehicles. LIBs used in various devices demand a number of basic performance requirements, such as being lightweight, having a long calendar and cycle life, and being capable of fast charging. Some performance requirements of LIBs are more important depending on the specific purpose.

For example, electric vehicles require a fast charging speed with high current and long service life. To date these requirements have been considered interrelated and difficult to simultaneously achieve because the high current needed for fast charging reduces the service life of the battery. For instance, fast charging with a high charging rate affects the physical and chemical condition of the battery such as increasing temperature, increasing the voltage polarization, formation of a solid electrolyte interface (SEI) layer, and growing lithium dendrites. This explains why low charging rates are currently used for obtaining the full capacity of LIBs. LIBs may have a reasonable lifespan when they are designed, but this service life depends on the LIBs usage environment. The use of a high charging rate for fast charging is one of the factors that shorten a lifespan of a LIB. As such, service life and charging speed are interrelated. However, a problem with this relationship between charging speed and service life of LIBs is that battery service life must be sacrificed for fast charging, and fast charging must be given up for longer service life.

SUMMARY OF THE DISCLOSURE

In accordance with one aspect of the disclosure, a system includes a battery cell in which a liquid electrolyte is disposed and an acoustic transducer in mechanical communication with the battery cell. The acoustic transducer is configured to generate acoustic waves. The acoustic waves have a wavelength larger than a dimension of the battery cell such that the acoustic waves generate cavitation bubbles in the electrolyte.

In accordance with another aspect of the disclosure, a method of managing a battery, the battery including a cell that includes an electrode and a liquid electrolyte disposed within the cell of the battery, includes detecting a charging operation of the battery. The method of managing a battery also includes applying, with an acoustic transducer in mechanical communication with the cell of the battery, acoustic waves to the cell of the battery, the acoustic waves being applied during the charging operation of the battery. The acoustic waves have a wavelength larger than a dimension of the cell of the battery such that the acoustic waves generate cavitation bubbles in the electrolyte disposed within the cell of the battery.

In accordance with yet another aspect of the disclosure, a system for reducing an impedance of a battery cell during a charging state of the battery cell, the battery cell including an electrode and a liquid electrolyte disposed within the battery cell, includes a battery pack, where the battery cell is one of a plurality of battery cells of the battery pack, and an acoustic transducer in mechanical communication with the battery pack. The acoustic transducer is configured to generate, during the charging state of the battery cell, bulk acoustic waves that propagate throughout the plurality of battery cells. The bulk acoustic waves generate cavitation bubbles in the liquid electrolyte disposed within the battery cell. A collapse of the cavitation bubbles produces high speed and high pressure microjets perpendicular to a formation on a surface of the electrode, such that a size of the formation is reduced by the microjets contacting the formation.

In connection with any one of the aforementioned aspects, the systems, devices and/or methods described herein may alternatively or additionally include or involve any combination of one or more of the following aspects or features. The acoustic waves include ultrasonic waves. The acoustic transducer generates acoustic waves at a predetermined frequency between 20 kHz and 10 MHz. The acoustic transducer is positioned relative to the battery cell such that the acoustic waves are bulk acoustic waves. The battery cell includes an electrode and the acoustic transducer is positioned such that microjets arising from the cavitation bubbles are directed toward the electrode. The system further includes a battery pack, where the battery cell is one of a plurality of battery cells of the battery pack and the battery pack is pre-stressed such that the acoustic waves propagate throughout the plurality of battery cells. The battery cell is configured as a lithium-ion battery. The battery cell includes a prismatic pouch cell. The prismatic pouch cell includes a plurality of layers, each layer of the plurality of layers including an anode, a cathode spaced apart from the anode, an electrolyte disposed between the anode and the cathode, and a separator disposed within the electrolyte between the anode and the cathode. The plurality of layers is disposed within the prismatic pouch cell in a jelly roll configuration. The acoustic transducer includes a piezoelectric transducer. A collapse of the cavitation bubbles causes a formation of high speed and high pressure microjets, the microjets being perpendicular to a surface of the electrode. The microjets reduce a thickness of a layer on the surface of the electrode, such that an impedance of the battery is reduced allowing for fast charging of the battery. The reduction of the thickness of the layer on the surface of the electrode minimizes a degradation effect of the battery. The degradation effect includes dendrite formation. The microjets enhance the transport of materials inside the electrolyte, such that an impedance of the battery is reduced allowing for fast charging of the battery. A frequency range of the bulk acoustic waves is predetermined, such that an effect of the microjets on the formation of the surface of the electrode is maximized and damage to the battery cell, the battery pack, the electrode, or combinations thereof, is minimized. Sizes of the cavitation bubbles are based on the frequency range of the bulk acoustic waves.

BRIEF DESCRIPTION OF THE DRAWING FIGURES

For a more complete understanding of the disclosure, reference should be made to the following detailed description and accompanying drawing figures, in which like reference numerals identify like elements in the figures.

The embodiments of the disclosed systems and methods may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

Devices and systems for charging and managing a battery are described. Methods for using such devices are also described. The disclosed methods and systems generally include a battery cell and an acoustic transducer in mechanical communication with the battery cell. A liquid electrolyte is disposed within the battery cell. The acoustic transducer is configured to generate acoustic waves. The acoustic waves have a wavelength larger than a dimension of the battery cell such that the acoustic waves generate cavitation bubbles in the electrolyte.

The acoustic waves may be bulk waves, such as bulk ultrasonic waves, with a predetermined frequency. The battery cell may be a lithium-ion battery (LIB) and may be configured as a prismatic pouch cell including a plurality of layers, each layer of the plurality of layers including an anode, a cathode spaced apart from the anode, an electrolyte disposed between the anode and the cathode, and a separator disposed within the electrolyte between the anode and the cathode. The plurality of layers may be disposed within the prismatic pouch cell in a jelly roll configuration. The acoustic transducer may be a piezoelectric transducer.

Knowing how a battery ages, and in particular how a LIB ages, helps to understand the relationship between fast charging with a high current and the long service life of the battery. There are two important issues in the aging mechanism of a LIB. When a LIB is charged and discharged repeatedly or stored, these two issues lead to lithium-ion cell degradation. The first issue is the loss of active materials including anode and cathode materials and available lithium ions, which are the means of storing energy in each electrode. The second issue is the increased impedance within the cell. These two issues are interrelated and may depend on, or be influenced by, any number of factors. For example, design factors for a battery cell, such as choice of anode, cathode, electrolyte, and the like, and design factors for a battery pack, such as mechanical stress and type of cooling system, may influence certain side reactions that in turn influence how a LIB degrades. Production factors, such as production line humidity, electrolyte filling method, and formation method, may also influence battery degradation by causing certain side reactions. Application factors (i.e., how the battery is used), such as temperature, load, and voltage during use, may also cause certain side reactions that impact the degradation of a battery.

Side reactions may include, for example, processes such as electrode particle cracking, solid electrolyte interface (SEI) or cathode electrolyte interface (CEI) layer formation and thickening, transition metal dissolution, lithium plating/dendrite formation, graphite exfoliation, binder decomposition, structure disordering, corrosion of current collectors, and electrolyte decomposition. For example, once a side reaction occurs between the electrolyte and the electrodes, organic and inorganic products may be created. These products may thicken a membrane, such as a SEI layer, on the electrode surface. At the same time that an SEI layer is formed on electrodes, recurring intercalation of lithium ions causes stress on electrodes and the electrodes begin to expand. This expansion of electrodes detaches electrodes from the current collector, resulting in electrical isolation. This electrical isolation of internal components is one of the factors of the increasing impedance of battery pouch cells.

The electrolyte may have a reduction or oxidation process, which also causes increasing impedance within a battery cell. In the process of repetitive charging and discharging, lithium-ion consumption may occur with electrolyte decomposition, forming a protective SEI layer on the surface of the anode electrode. A SEI layer also forms on the cathode electrode, though typically much thinner than an anode SEI layer. This SEI layer may be mostly formed during the first charging process, which results in a rapid degradation of battery capacity. When the battery charge and discharge process continues, the graphite anode may change about 10% in volume due to lithium-ion intercalation and deintercalation, which may cause the SEI layer to break. This breaking phenomenon may cause contact and a reaction between lithiated graphite and the electrolyte resulting in the consumption of electrolytes and lithium ions inventory. This process may continue to increase the SEI thickness. The formation and thickness increase of the SEI layer may lead to a reduction in battery capacity and an increase in internal resistance of the battery, which leads to an increased impedance. An increased impedance causes the battery to heat up and the voltage to drop, which causes undesirable slow charging.

The SEI layer may be a complex bilayer structure consisting of inorganic and organic materials. In the case of the inorganic part, the SEI layer may be mainly composed of salt degradation products. In the case of the organic part, the SEI layer may be composed of reduction products of electrolytes. The composition and thickness of the SEI layer may not remain constant while the battery is operating or stored. Inorganic materials may be located inside the SEI layer and may be in contact with the electrodes and may have very stable and insoluble properties. Organic materials may have soluble properties and may be in contact with the outside of the SEI layer, such as with electrolytes. The thickness of the SEI layer may be from a few angstrom (Å) to hundreds of Å. Outer SEI layers and inner SEI layers may be formed by changes in the potential of the negative electrode. When the negative electrode potential is high, it is made of organic material, which creates a low-density membrane with low conductivity and highly resistive. On the contrary, when the potential is lowered, it is made of inorganic material, which creates a high conductivity but compact membrane inside. Eventually, the SEI layer becomes an outer layer of low conductivity and organic material that may have a decisive effect on battery impedance and performance. Removing the SEI layer, especially an outer organic layer, may reduce battery impedance by removing foreign substances from the electrodes. At the same time, it can be expected that capacity will be restored by increasing the lithium-ion inventory used to form the SEI layer.

A LIB may consist of electrodes, current collectors, and electrolytes. An easy approach to change properties of a LIB is to change the design of the LIB, including components of the LIB such as electrodes and electrolytes. Therefore, many attempts have been made to change the components of LIBs to improve its performance. Lithium cobalt oxide ($LiCoO_2$) as the cathode and graphite as the anode are still the most commonly used materials for LIBs. The development trend of cathode materials is the substitution of materials with high energy density and potential. Although lithium cobalt oxide is the most commonly used cathode material to date, its market share is gradually decreasing depending on the cost and resource availability. To control the impedance of the lithium-ion cell and increase the active material, recent research has focused on changing electrodes represented by lithium manganese oxide ($LiMn_2O_4$) and lithium iron phosphate with olivine structure ($LiFePO_4$) as a cathode material, which offers high energy density. For anode material, much effort has been made in developing new material including metal oxides and lithium (Li) metal alloy that can further increase the capacity of LIBs. Recent electrolyte studies have focused on developing functional electrolyte additives to improve performance, or on developing a safe electrolyte solution that is a flame-resistant or non-flammable electrolyte solution. Although these methods may improve the basic performance of LIBs, it is difficult to re-design the overall battery, which is time intensive and expensive.

In addition to chemical approaches to modify LIB behavior, such as limiting the formation of an SEI layer, physical or mechanical approaches have been attempted as well, such as using ultrasound waves as a means of controlling the thermal effect on lithium-ion cells by improving conventional heat transfer processes. Some approaches have used surface waves to propagate through metallic layers. However, these approaches require higher frequencies that may damage individual components of a battery and are limited to battery configurations having complex circuits or metallic layers embedded therein. Further, the solutions are not amenable to a vast majority of applications, such as electric vehicles. Therefore, there is a need for a simple and effective method of controlling an impedance of a battery to increase charging speed while also managing and improving the state of health of the battery to reduce battery aging, and which is easily applicable to a wide range of applications.

The proposed solution disclosed herein focuses on the charging performance and health management of batteries. Specifically, the proposed solution uses energy transmission from ultrasonic waves to change the performance of a LIB having liquid medium as an electrolyte. In this regard, the proposed solution applies to all current and future LIBs containing liquid electrolytes. More specifically, the disclosed solution creates bulk ultrasound waves transmitted into the electrolyte, which creates cavitation bubbles inside the battery cell. When the cavitation bubbles expand, contract and collapse under the influence of the ultrasonic waves, it creates microjets inside the electrolyte, as will be described below with respect to FIG. 1. The microjets have two major effects: they reduce the thickness of the SEI layer, and they enhance the transport inside the electrolyte. The result is significantly reduced impedance of the battery allowing for fast charging. The impedance reduction enables charging at speeds significantly faster than possible today, and at a higher charging rate. In addition, the control of the SEI layer enables the rejuvenation of the battery and the destruction of dendrites that affect the aging of the battery. As will be discussed below, the overall impedance may be reduced by more than 40% and the charging time with ultrasonic waves at a high charging rate may increase by 44% compared to charging without ultrasonic waves. In addition, controlling the thickness of the SEI layer enables the performance recovery of aged LIBs.

As described above, there are two key challenges hindering the wide use of such batteries in many applications such as electric vehicles and large-scale energy storage, namely the ability to charge the battery fast, and the ability to manage the battery life. The proposed solution addresses these two issues using a mechanical approach as opposed to the chemical approaches taken by conventional solutions. Therefore, the proposed solution has the advantage of being able to be quickly applied to mass-produced commercial LIBs without any chemical or structural changes to the LIBs.

Although described in connection with LIBs having a prismatic pouch cell configuration for use with electric vehicles, the disclosed methods and devices may be applied to a wide variety of battery cell configurations and use applications. The present disclosure is applicable to cylindrical as well as prismatic batteries, with jellyrolls or pouch cells, and may be used in many consumer, military, and automotive applications, such as power tools, medical devices, laptops, tablets, mobile phones, e-bikes, drones, various electric powertrains, and energy storage systems.

Figure 1:
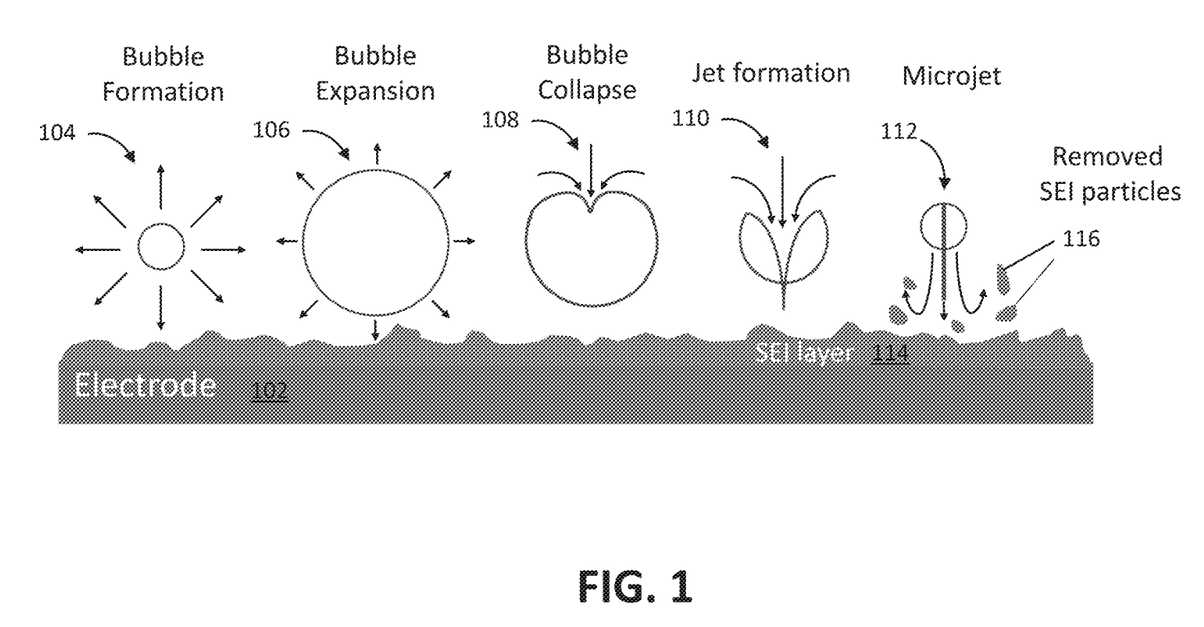
FIG. 1 illustrates the order of cavitation bubble and microjet formation near an electrode in accordance with one example.

FIG. 1 depicts the order of cavitation bubble and microjet formation near an electrode 102. Cavitation is the rapid formation and collapse of vapor bubbles within a liquid because of the rapid pressure oscillation of ultrasound. When water pressure is changing, the vaporization point changes along with the pressure change of water. At high pressure, the point of vaporization of the water decreases. This is how the cavitation bubble is created at low temperature but high pressure. Based on this theory, cavitation occurs when the static pressure becomes smaller than a liquid's vaporization pressure. Due to the basic nature of ultrasonic waves with high frequencies, the high power of ultrasound can make those circumstances for making a cavitation bubble inside electrolyte which is absorbed in a polymer structure between electrodes. Periodic pressure change from high power ultrasound can make conditions for bubble formation 104 as seen in FIG. 1. The cavitation bubbles may range in size and may be dependent or based on a frequency range of the acoustic waves that cause their formation. The initial radius and position of the cavitation bubbles may be predetermined as well. The bubbles expand and collapse periodically. When a bubble reaches a maximum radius 106, the bubble begins to collapse 108 fast. This fast collapse 108 of the bubble causes a jet formation 110 at the top surface of the bubble and it develops into a microjet 112. The resulting microjet 112 has high speed and high pressure, with a direction towards the surface of the electrode 102 (i.e., the microjets 112 are perpendicular to a surface of the electrode 102), as shown on the right in FIG. 1.

These microjets 112 near the electrode 102 have two major effects inside the electrolyte. First, the microjets 112 can reduce the thickness of the SEI layer 114. The cavitation bubble collapse 108 in the ultrasound field creates the microjets 112 and the speed and pressure of these microjets 112 towards the surface of the electrode 102 are enough to remove SEI particles 116 on the electrodes 102, as shown in FIG. 1. This surface cleaning effect of microjets 112 allows the thickness of the SEI layer 114 on the electrode 102, or the size of any other formation on the electrode 102, to be reduced or removed. In this way, the size of a formation on a surface of the electrode 102 is reduced or controlled by the microjets 112 contacting the formation at high speed and pressure. The reduction of the thickness of these layers or the size of the formations on the surface of the electrode 102 minimizes a degradation effect of the battery, such as dendrite formation. As a result, impedance of the battery is reduced allowing for fast charging of the battery. Second, the microjets 112 can enhance the transport of materials inside the electrolyte due to their properties of high pressure and speed. In this way, the microjets 112 may increase the energy of lithium-ion in electrolytes and help to move the mass transfer in electrolyte faster than without ultrasound waves. This enhanced transport also reduces impedance of the battery and allows for fast charging of the battery.

Figure 2:
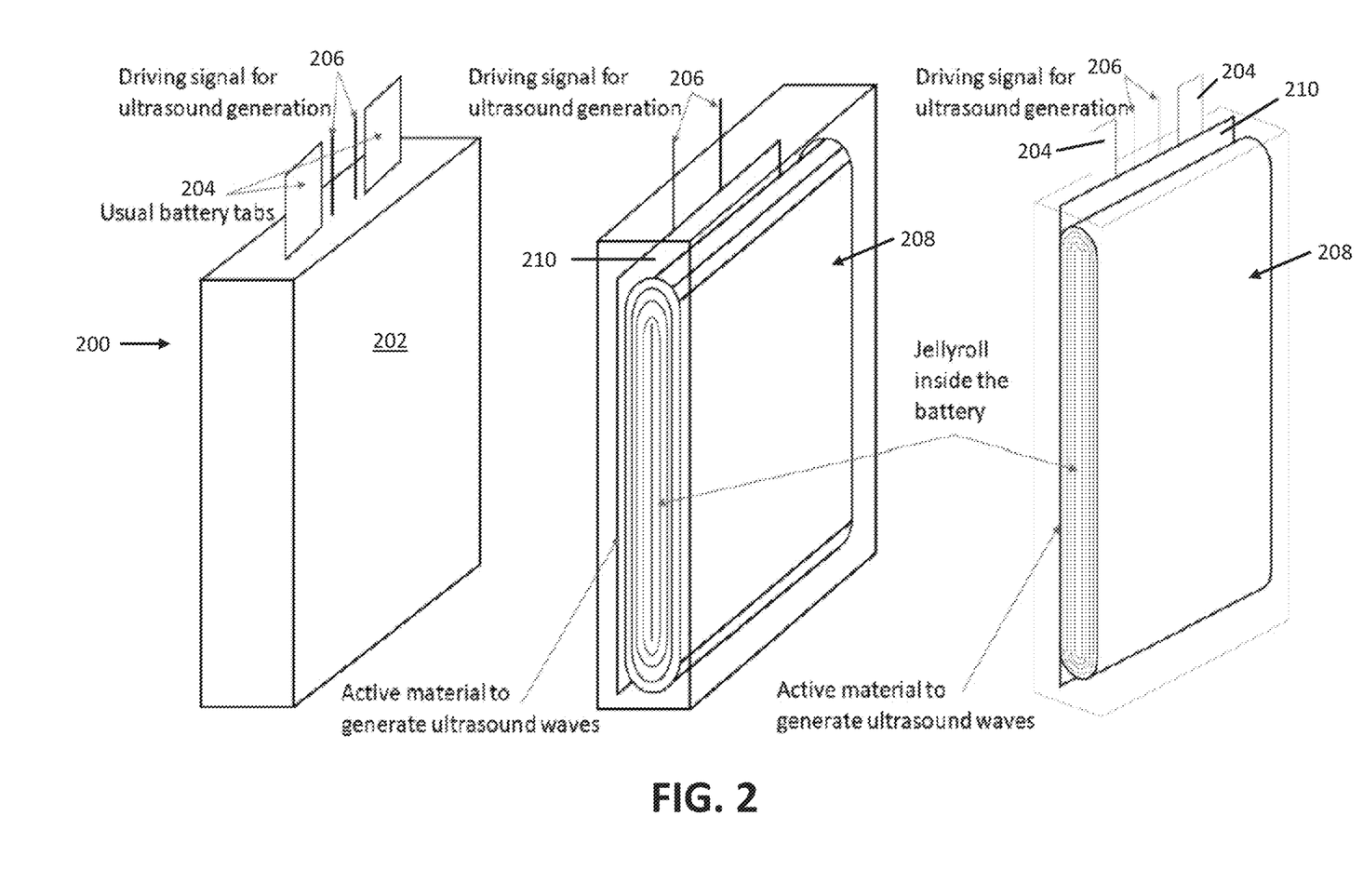
FIG. 2 illustrates a perspective view of a battery in accordance with one example.

FIG. 2 illustrates a battery system 200 in accordance with one example. As shown in FIG. 2, the battery system 200 includes a housing 202 (i.e., casing) and battery tabs 204 disposed at one end of the housing 202 (left image of FIG. 2). Located in between the battery tabs 204 are driving signals 206 used to generate ultrasound. The battery system 200 also includes a battery cell 208 and an acoustic transducer 210 disposed within the housing 202 (center image of FIG. 2). The acoustic transducer 210 is in mechanical communication with the battery cell 208. In other words, the battery cell 208 and the acoustic transducer 210 are mechanically coupled together. Herein, the phrase "coupled together" or "coupled with" is defined to mean directly connected to or indirectly connected through one or more intermediate components. In one example, the battery cell 208 is directly adjacent and connected to the acoustic transducer 210. The driving signals 206 are coupled with the acoustic transducer 210.

A liquid electrolyte (not shown) is disposed within the battery cell 208. In one example, the battery cell 208 is configured as a lithium-ion battery. The battery cell 208 may include a lithium-ion polymer type of prismatic pouch cell, the prismatic pouch cell including a plurality of layers, each layer of the plurality of layers including an anode, a cathode spaced apart from the anode, an electrolyte disposed between the anode and the cathode, and a separator disposed within the electrolyte between the anode and the cathode. The separator may be a porous material in between the electrodes (anode and cathode), such that the separator becomes soaked with electrolyte. In one example, the electrolyte may be absorbed in the polymer structure of the prismatic pouch cell to convey lithium ions from each electrode (i.e., between the anode and cathode). In other words, ions may move from one electrode to another by diffusing through the electrolyte, navigating through the polymer separator, and then passing through the SEI layer. Impedance is what restricts this movement of ions from electrode to electrode, so reducing impedance thereby improves battery functionality, including charging. The chemistry of the lithium-ion prismatic pouch cell may consist of lithium cobalt oxide as cathode material and graphite as anode material. Copper and aluminum metals may be respectively used for the current collector of anode and cathode electrodes. The prismatic pouch cell may have a polymer electrolyte that is made of polyethylene oxide with a lithium salt, such as Lithium hexafluorophosphate ($LiPF_6$), ethylene carbonate (EC), and dimethyl carbonate (DMC). Other types of cathode materials, anode materials, current collectors, and electrolytes may be used.

As shown in FIG. 2, the plurality of layers may be disposed within the prismatic pouch cell in a jelly roll configuration (center and right images of FIG. 2). A jelly roll, or swiss roll, configuration may include an insulating sheet, a layer of anode material on top of the insulating sheet, a separator layer on top of the anode material, and a layer of cathode material on top of the separator layer. This "sandwich" of layers is then rolled up and pressed to fit within the housing 202 of the battery system 200. Other configurations are possible. For instance, the battery cell 208 may be a cylindrical battery cell. In another example, the plurality of layers may be stacked within the prismatic pouch cell as opposed to rolled and pressed, similar to a conventional pouch cell configuration.

The acoustic transducer 210 may be an active material used to generate ultrasound waves (i.e., ultrasound generator). As such, the acoustic transducer 210 may be a piezoelectric transducer configured to generate acoustic waves. The acoustic waves may include ultrasonic waves. The acoustic waves may have a wavelength larger than a dimension of the battery cell 208 such that the acoustic waves generate cavitation bubbles in the electrolyte, as discussed above with regard to FIG. 1. Acoustic waves with wavelengths larger than the battery cell 208 ensures that cavitation bubbles form within the electrolyte while avoiding having to vibrate (and potentially damage) the battery cell 208, as will be discussed below. In this regard, the acoustic waves may be bulk waves (i.e., bulk acoustic waves) that propagate through the entire battery cell 208, including solids. The acoustic transducer 210 may be positioned relative to the battery cell 208 such that bulk acoustic waves are formed. In one example, the wavelength of the acoustic waves falls in a range from about 7.5 cm to about 0.15 mm, which corresponds to acoustic wave frequencies between 20 kHz and 10 MHz. For example, the wavelength of the acoustic waves may be 3.75 cm which corresponds to approximately 40 kHz in the liquid electrolyte. At this frequency, the acoustic wavelength is larger than the battery cell 208. Consequently, the ultrasound-induced vibration produces no relative motion of the individual battery cell components with respect to other battery cell components. This allows increased sound power levels without damaging the battery cell 208 thus better cleaning capability. In another example, the acoustic waves may have a wavelength larger than a thickness of the electrode and separator combined.

As discussed above, the battery cell 208 may include an electrode 102. In this example, the acoustic transducer 210 is positioned such that microjets 112 arising from the cavitation bubbles are directed toward the electrode 102 (i.e., the microjets 112 are perpendicular to a surface of the electrode 102). As discussed above with respect to FIG. 1, microjets 112 directed toward the surface of the electrode 102 results in the removal of materials, such as removed SEI particles 116, other formations, and/or dendrites.

Figure 3:
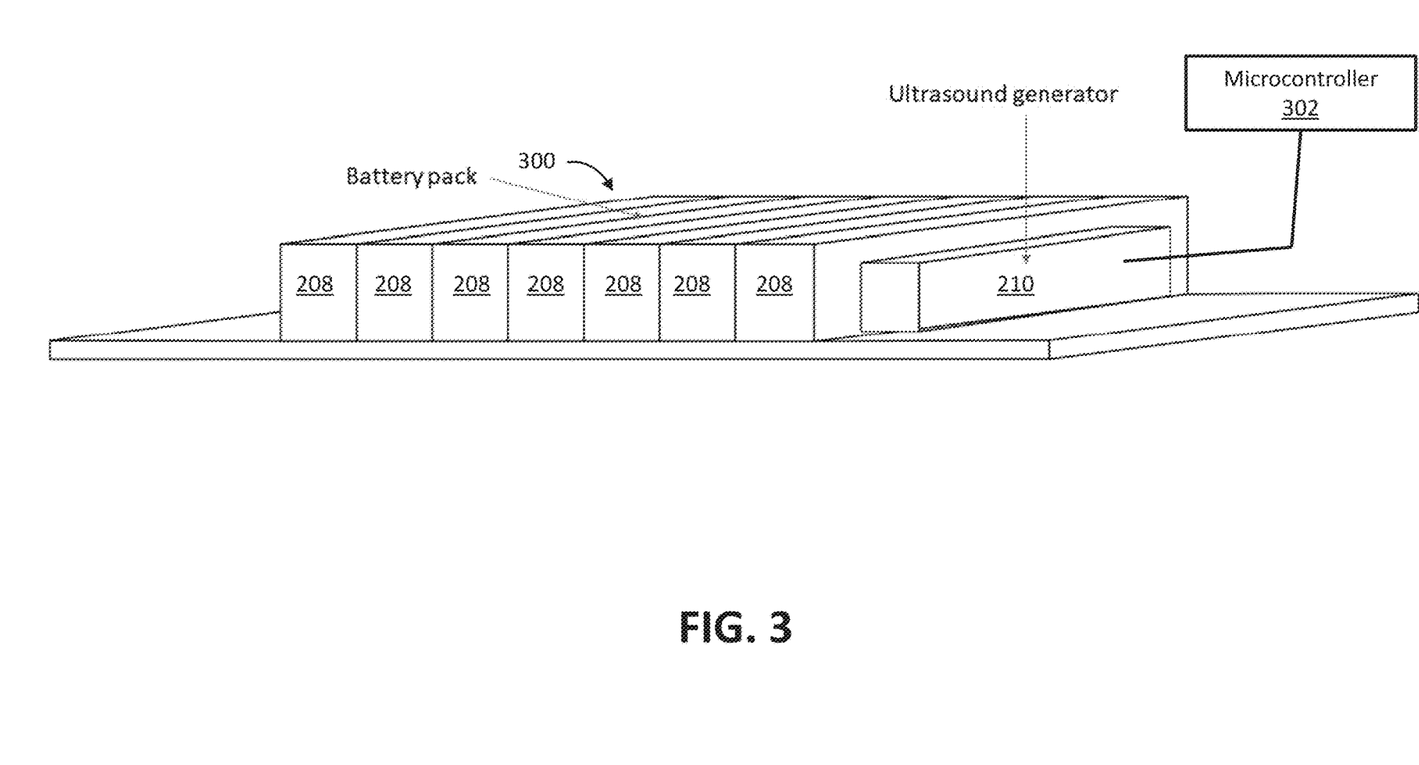
FIG. 3 illustrates a perspective view of a battery pack in accordance with one example.

The battery system 200 described above may also include a battery pack 300, as shown in FIG. 3. The battery pack 300 may include a plurality of battery cells 208, such as the battery cell 208 described above with respect to FIG. 2. In other words, the battery cell 208 described above may be one of a plurality of battery cells 208 of the battery pack 300. The battery pack 300 shown in FIG. 3 includes seven battery cells 208, but any number of battery cells 208 is possible. In this example, the acoustic transducer 210, or ultrasound generator, is disposed at one end of the battery pack 300. As shown in FIG. 3, the ultrasound generator 210 is disposed on the right-side end of the battery pack 300. However, other configurations are possible. For example, the ultrasound generator 210 may be disposed on the opposite (i.e., left side) end of the battery pack 300. In another example, the ultrasound generator 210 may be disposed above or below the battery pack 300. In each case, the ultrasound generator 210 may be adjacently connected (i.e., mechanically coupled) to the battery pack 300. The battery pack 300 may be pre-stressed such that the acoustic waves propagate throughout the plurality of battery cells 208. In other words, if the battery pack 300 is pre-stressed, the battery cells 208 are tightly packed together, and vibrations propagate more easily. In one example, the ultrasound generator 210 may be included in the mechanism that pre-stresses the battery pack 300. In another example, an acoustic transducer 210 may be located in each battery cell 208 of the plurality of battery cells 208 of the battery pack 300. In this example, respective acoustic transducers 210 would generate respective acoustic waves for respective battery cells 208. In this way, the ultrasound generator 210 may be embedded inside a battery system 200 or be external to the battery system 200.

In some cases, some of the acoustic wave generation is implemented by a microcontroller 302 or other processor integrated with the ultrasound generator 210. As shown in FIG. 3, the ultrasound generator 210 may include, or be couple with, a microcontroller 302. The microcontroller 302 may include a processor and a memory on which similar wave generation and/or other instructions are stored. In one example, in which the battery pack 300 is part of an electric vehicle, the microcontroller 302 may be or include an electronic control unit (ECU).

In yet another example, instead of, or in addition to, the acoustic transducers 210, acoustic waves may be supplied to the plurality of battery cells 208 of the battery pack 300 by a cooling liquid of a liquid cooling system of a liquid cooled battery pack. In this example, acoustic waves are applied to the cooling liquid and the cooling liquid then provides or delivers the acoustic waves to the battery cells 208 being cooled by the cooling liquid. In this way, vibrations are transmitted through the cooling liquid to the battery cell 208, which allows the ultrasound transducer 210 to be physically separated from the battery cell 208 since the cooling liquid is well matched to the liquid electrolyte and ultrasound energy passes with minimum insertion loss from the cooling liquid to the liquid electrolyte. Thus, it is also possible to transmit large ultrasound power through the cooling liquid.

Figure 4:
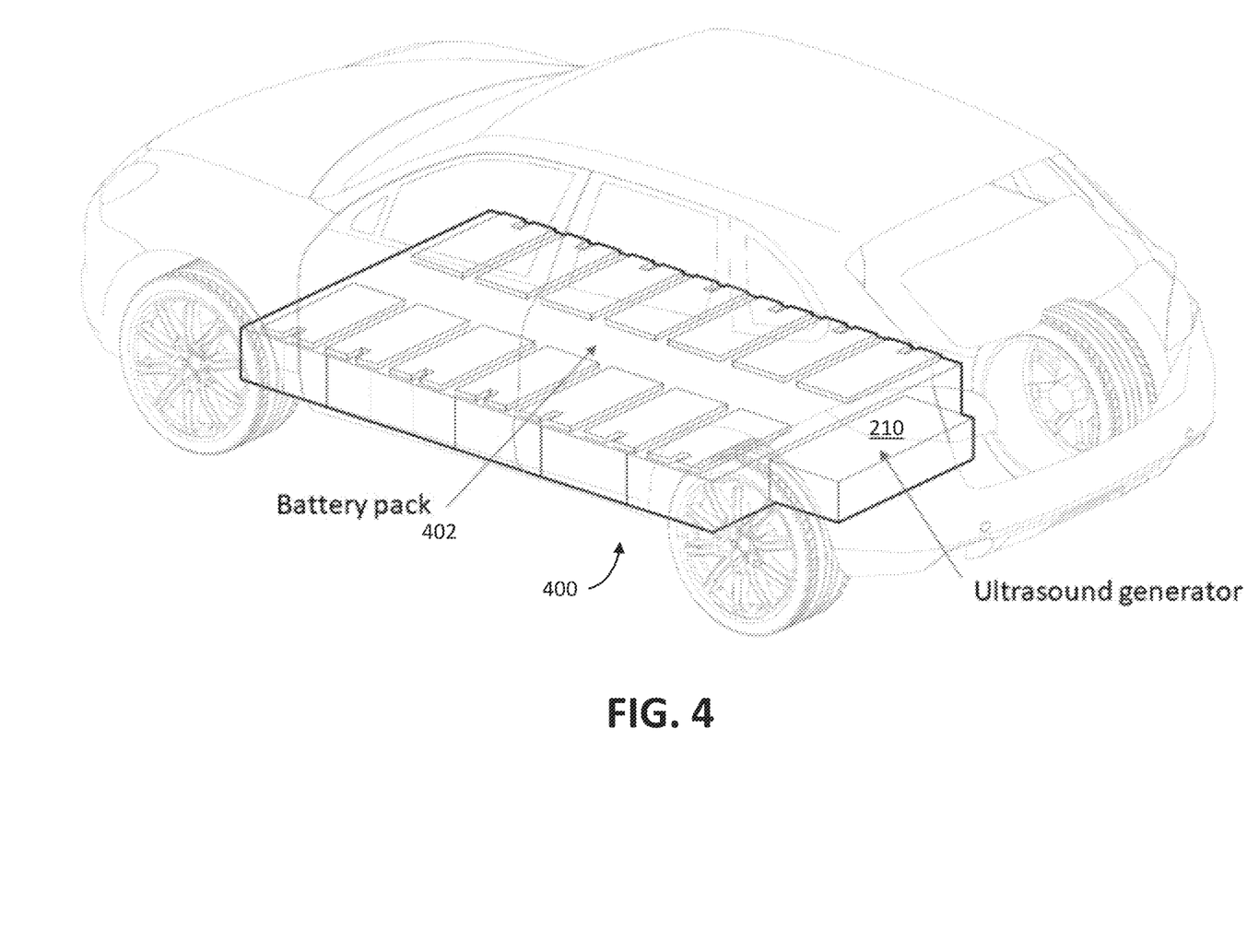
FIG. 4 illustrates a system for reducing an impedance of a battery cell during a charging state of the battery cell in accordance with one example.

FIG. 4 illustrates a system 400 for reducing an impedance of a battery cell during a charging state of the battery cell in accordance with one example. As shown in FIG. 4, the disclosed system 400 may be part of an electric vehicle. Each cell of this system 400 may be designed and configured the same as the cell 208 disclosed above with regard to FIG. 2. In this example, each cell includes an electrode and a liquid electrolyte disposed within the cell. The system 400 of FIG. 4 includes a battery pack 402, where a cell is one of a plurality of cells of the battery pack 402. The system 400 of FIG. 4 also includes an acoustic transducer 210 in mechanical communication with the battery pack 402. The acoustic transducer 210 may be configured to generate, during the charging state of the battery cell, bulk acoustic waves that propagate throughout the plurality of cells. As discussed above, since the battery pack 402 is pre-stressed and the ultrasound generator 210 is mechanically coupled to the battery pack 402, the acoustic waves propagate through the entire battery pack 402, including solid portions of the battery pack 402. The bulk acoustic waves generate cavitation bubbles in the liquid electrolyte disposed within the battery cell. As discussed above, a collapse of the cavitation bubbles produces high speed and high pressure microjets perpendicular to a formation on a surface of the electrode, such that a size of the formation is reduced by the microjets contacting the formation.

A frequency range of the bulk acoustic waves may be predetermined, such that an effect of the microjets on the formation of the surface of the electrode is maximized and damage to the battery cell, the battery pack, the electrode, or combinations thereof, is minimized. In other words, the bulk acoustic waves are formed based on a specific frequency to create certain size cavitation bubbles and to have a particular wavelength so that the bulk acoustic waves propagate throughout the entire battery pack while individual components of the battery pack or battery cells are not resonating individually. This approach reduces the risk of individual battery cells and components therein being vibrated or shaken due to the acoustic waves. Thus, the proposed system alleviates concerns of breaking the battery pack and/or battery cells, which is a concern with surface waves.

As mentioned above, sizes of the cavitation bubbles may be based on the frequency range of the bulk acoustic waves. In one example, the size of the cavitation bubbles may range from 0.1 to 25 micrometer. Other sizes are possible.

Figure 5:
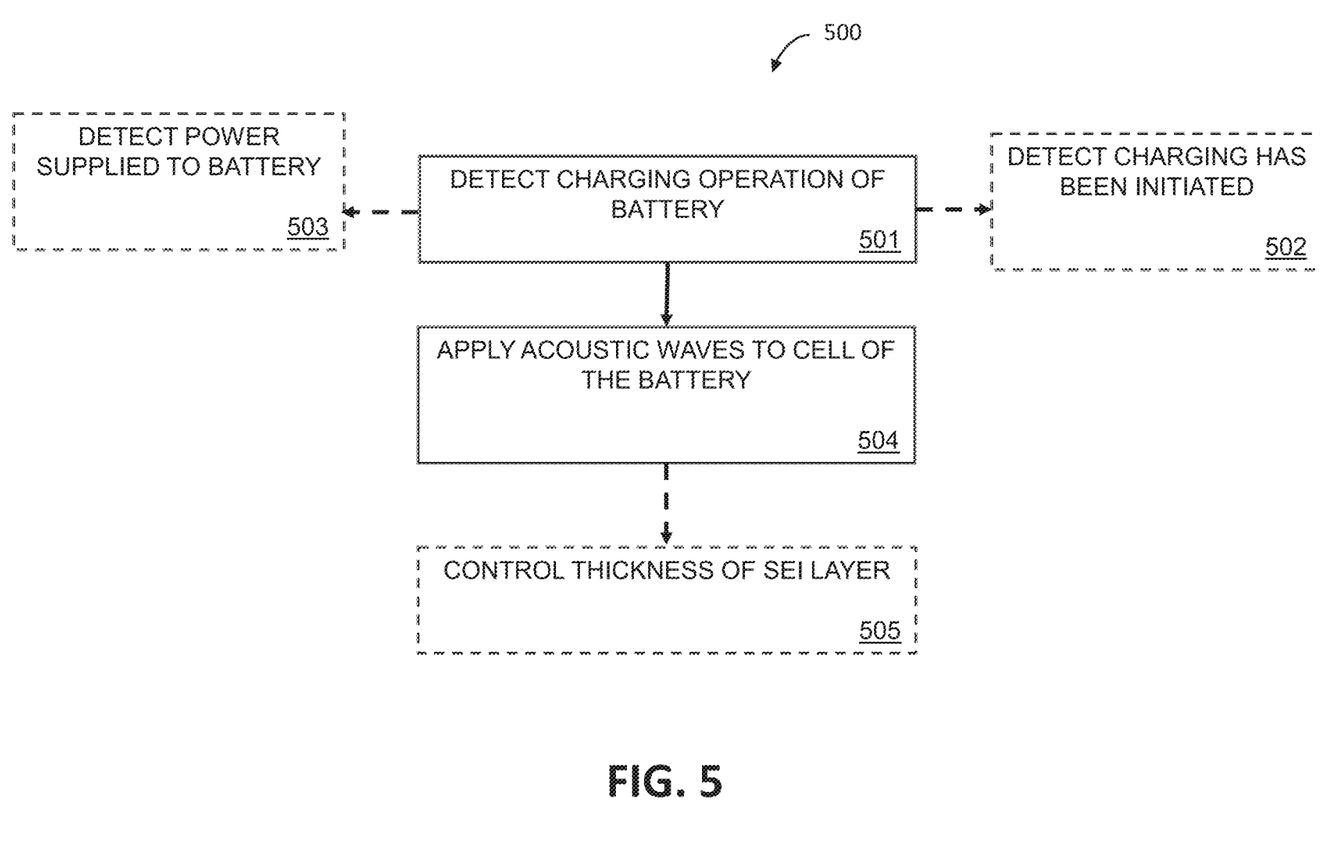
FIG. 5 illustrates a flow chart depicting a method of managing a battery in accordance with one example.

FIG. 5 illustrates a flow chart depicting a method 500 of managing a battery in accordance with one example. The method 500 of FIG. 5 may be implemented using the battery cell 208 described above. For example, the method 500 of managing a battery may be used with a cell that includes an electrode and a liquid electrolyte disposed within the cell of the battery. In other examples, a different battery cell may be used. In one example, the battery may be part of a battery pack of a system of an electric vehicle, such as the systems described above with respect to FIGS. 3 and 4. The method 500 may be implemented by a controller, such as the microcontroller 302 discussed above with respect to FIG. 3. The method 500 may be implemented in the order shown but may be implemented in or according to any number of different orders. Additional, different, or fewer acts may be provided. In one example, the method 500 may be performed while the vehicle in which it is part of is not operating (i.e., parked in a non-started state). In another example, the method 500 may be performed during operation of the vehicle (and thus during operation of the battery). In the latter example (during operation of the vehicle and the battery), the step of detecting a charging operation of the battery (act 501) may be omitted.

The method 500 of managing a battery may include detecting a charging operation of the battery (act 501). The charging operation may be when the battery is being charged. In one example, the charging operation may be detected as soon as charging has been initiated (act 502). In another example, the charging operation may be detected when power is supplied to the battery (act 503) (i.e., when the battery is connected to a power source). As discussed above, in the example of the battery being part of a battery pack implemented in an electric vehicle, this step (act 501) may be performed while the vehicle in which the battery is part of is in a non-operating state (i.e., parked and turned off). In another example, this step (act 501) may be performed during operation of the vehicle.

The method 500 of managing a battery may also include applying, with an acoustic transducer in mechanical communication with the cell of the battery, acoustic waves to the cell of the battery (act 504). The acoustic waves may be applied during the charging operation of the battery. In another example, the acoustic waves may be applied when the battery is in a non-charging state (i.e., during the operation of the battery). The acoustic waves may have a wavelength larger than a dimension of the cell of the battery such that the acoustic waves generate cavitation bubbles in the electrolyte disposed within the cell of the battery. As discussed above, the wavelength of the acoustic waves may be in a range from about 0.15 mm to about 7.5 cm. The acoustic waves may be bulk acoustic waves.

A collapse of the cavitation bubbles may cause a formation of high speed and high pressure microjets, the microjets being perpendicular to a surface of the electrode of the cell of the battery. The resulting microjets may reduce a thickness of a layer on the surface of the electrode, such that an impedance of the battery is reduced. The reduced impedance may allow for fast charging of the battery. As will be discussed below, the charging performance of battery cells with ultrasound waves improves with higher charging rates (C-rates) (i.e., the higher the C-rate, the faster the charge). For example, for 2 C and 2.5 C-rates, the constant current charging time may increase by 11% and 25%, respectively, and in some cases for the higher charging rates the constant current charging time may increase up to 44% with ultrasound vs no ultrasound, indicating that significantly more energy is stored in the battery (i.e., high charge capacity) when ultrasound is on during fast charging. Without ultrasound, the polarization due to high impedance leads to small charge capacity during fast charging. Charging with high C-rates typically involves high mass transport of lithium ions, which lead to repeated formation of lithium dendrite growth and SEI layers, also contributing to accelerated capacity fading and decreased charging efficiency. However, ultrasound waves may help overcome these difficulties, and the use of ultrasonic waves during the high C-rate charging process may not degrade battery performance.

The method 500 may include one or more additional acts. In one example, the method 500 may also include controlling a thickness of a layer on a surface of the electrode (act 505). The reduction of the thickness of the layer on the surface of the electrode may minimize a degradation effect of the battery, such as dendrite formation. The microjets may also enhance the transport of materials inside the electrolyte, such that an impedance of the battery may be reduced allowing for fast charging of the battery.

As discussed above, the disclosed microjet formation from a cavitation bubble induced by ultrasound waves removes the SEI layers on electrodes and enhances the transport inside electrolyte which reduces the impedance of a cell of a battery. However, while it is important to improve the performance of battery cells through ultrasound waves, it is also important to prohibit the degradation of the performance of the battery after the transmission of the ultrasound waves. As discussed in more detail below, the effect of ultrasound waves on a cell of a battery may be reversible.

Experimental Evidence

Experiments performed support the proposed solution disclosed above. For example, the performance of lithium-ion pouch cells with liquid electrolytes and 400 mAh capacity were analyzed. A commercial pouch cell was used to measure the impedance during sonication. As discussed above, one factor for the impedance of LIBs is SEI layers which are normally formed on electrodes and getting thicker after every charging process. The impedance of a pouch cell was significantly reduced in the experiment due to a microjet induced by the cavitation effect from ultrasonic waves in a liquid electrolyte. The overall impedance of the pouch cell was reduced by more than 40% under the ultrasound sonication condition. To verify fast charging capability using high charging current, the battery was charged with 1 C-rate (400 mA), 2 C-rate (800 mA) and 2.5 C-rate (1000 mA) following constant current charging method with and without ultrasonic waves. In particular, charging time (capacity) with ultrasonic waves in charging using 2.5 C-rate (1000 mA) increased by 44% compared to charging without ultrasonic waves. The increase in charging time using high current in the constant current charging protocol enables fast charging, meaning that high charge capacity can be achieved with high current.

Figure 6:
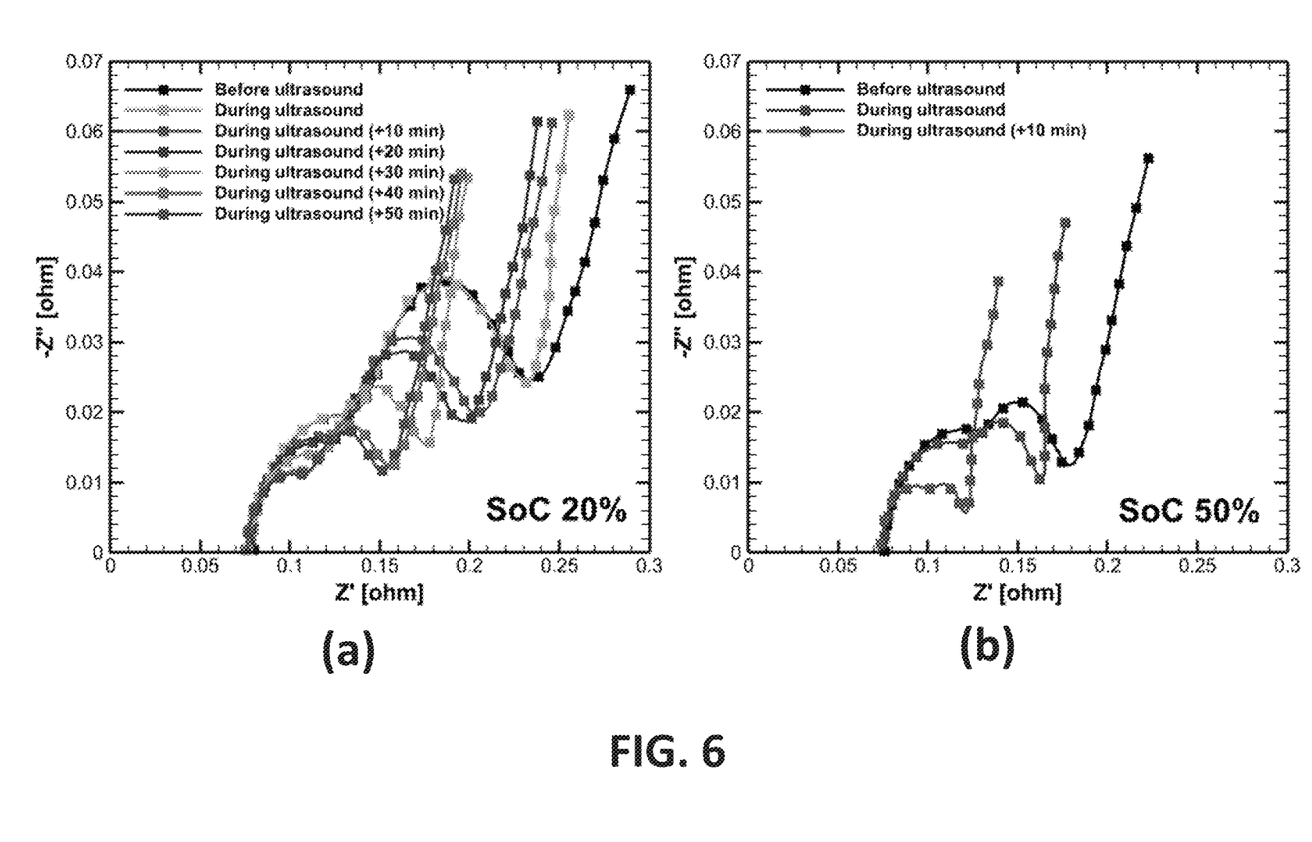
FIG. 6 depicts graphical plots of data for experimentally measured impedance spectroscopy for a battery cell in two different levels of state of charge in accordance with one example.

FIG. 6 depicts graphical plots of data for experimentally measured impedance spectroscopy for a battery cell in two different levels of state of charge in accordance with one example. Electrochemical Impedance Spectroscopy (EIS) is an electrochemical measurement method. This method with varying frequency has small disturbance and is a good method of studying the performance and process inside a lithium-ion cell. Impedance is a transfer function based on ohm's law, the ratio of an input voltage, and output current. When constant current or constant voltage perturbation is applied from highest to lowest frequency (from left to right in the graphs of FIG. 6), a spectrum of impedance results may be achieved. EIS can be reflected in the electrochemical characteristic and the inner process of electrochemical systems more accurately. The overall impedance spectrum of batteries from EIS measurement is commonly divided into four parts. The starting point where the x value intersecting the x-axis represents the bulk resistance of the electric conductivity of the electrolyte, separator, and electrodes. This bulk resistance can be changed with components of LIBs. The second part is a semi-circle on the left-hand side which means the resistance of the SEI layer including a solid-state interface layer formed on the surface of the electrode. This part can be used to measure the impedance of the SEI layer, which can be confirmed to be directly related to the thickness of the SEI layer. The third part is a semi-circle on the right-hand side which is related to the resistance of faradaic charge-transfer resistance. This impedance is connected to the movement or kinetic energy of lithium ions in the electrolyte. The last part is related to the diffusion processes in the active material at very low frequencies.

EIS measurements were performed at two different levels of state of charge (SoC). The SoC is one of the indicators representing the current state of LIBs. This value is the charge level of LIBs by capacity. FIG. 6 shows the impedance measurement of 50% and 20% level of SoC with and without ultrasound. In 'during ultrasound' cases, each measurement plotted in the order of the time the ultrasound waves were transmitted. Ultrasound was turned on between 'before ultrasound' and 'during ultrasound', and each line had a 10-minute interval because it took 10 minutes to make a single measurement. The lower level of SoC, the bigger the impedance. As will be discussed, ultrasound reduces faradic charge-transfer resistance (Rct) and the resistance of the SEI layer formed on the electrode (Rsei). The longer the time, the greater the effect. Ultrasound does not affect the bulk resistance of the pouch cell. Pouch cells with different levels of SoC have different times for saturating the effect of decreasing impedances of the pouch cells. FIG. 6 (a) illustrates a pouch cell before ultrasound waves and during ultrasound waves for a certain period in the state of 20 percent level of SoC. FIG. 6 (b) illustrates a pouch cell before ultrasound waves and during ultrasound waves for a certain period in the state of 50 percent level of SoC.

As shown in FIG. 6, it can be seen that the first semi-circles on the left in two different levels of SoC are about the same size, which shows that resistance of the SEI layer including a solid-state interface layer does not have an SoC dependency. On the other hand, the second semi-circles on the right have strong SoC dependency (i.e., spreading with declining SoC which is especially true for low levels of SoC). From 100% to 60% the second semi-circles decrease, however, increase again at lower SoCs. An increase in the SoC level (both cases higher than or below 50%) results in the creation of an SEI layer caused by side reaction. This SEI layer has a large number of lithium ions stored in organic or inorganic material forms that cannot electrochemically react. This can be explained through the loss of active lithium ions resulting from a change in exchange current density of side reaction. By looking at the figures at different SoC levels, it is shown that the impedance reduction effect of ultrasound waves is applied differently.

In the 20% SoC level case, it can be seen that faradic charge-transfer resistance (Rct) decreased more than the resistance of the SEI layer formed on the electrode (Rsei). The longer the ultrasound is applied, the greater the decrease in Rct, but the smaller the decrease in Rsei. This is because each semi-circle not only affects itself but also affects components of each other. For example, Rsei is affected not only by the thickness of the SEI layers, but also by the charge transfer reaction rate at the electrode/electrolyte interface. Rct is affected by the thickness of the SEI layers as well as by the charge transfer reaction. The effect seems to be saturated for the first 20 minutes, but as shown impedance decreases as time increases until 50 minutes. The longer ultrasound transmission time is needed to reach close to 20 min case of the 50% case. Finally, the pouch cell, in which an ultrasonic wave with a SoC of 20% was transmitted for 60 minutes, was measured to have a 38% reduction in Rsei and a 15% decrease in Rct than the pouch cell with no transmitted acoustic waves.

In the 50% SoC level case, it is shown that Rct decreases as large as Rsei, and after 20 minutes, the effect is not saturated. Also, only 20 minutes of ultrasonic transmission could observe the effect of reducing impedance by about 30% or more. What is clear is that ultrasound waves have a definite effect on reducing the impedance of the pouch cell depending on the SoC levels.

These two impedance spectra of different levels of SoC pouch cells have common characteristics. From the high-frequency part, ultrasound waves do not affect the bulk resistance of the pouch cell. This means ultrasound waves do not affect the electric conductivity of the electrolyte, separator, and electrodes. On the other hand, first and second semi-circles are remarkably reduced through the propagation of ultrasound waves. The first semi-circle was reduced through the effect of removing the particle on the SEI layers by the microjet at high speed and high pressure in the direction toward the wall from the cavitation bubble. Next, the second semicircle also was decreased by the increasing mass transport for Lithium-ion intercalation inside electrolyte. Finally, in high-frequency areas, there was a difference between the slope of the straight line between the case before the ultrasound and the case during ultrasound waves.

Fast Charging: In the experiments for charging with 3 different charging rates (C-rates), the pouch cell was kept in either 'without ultrasound' or 'with ultrasound' state. As expected, the charging time was reduced as the C-rate increased, and the starting voltage increased with increasing C-rate. This voltage rise was caused by DC resistance of the pouch cell, which is determined by the DC resistance and the charging current. This voltage rise is one of the factors in determining the charging time for charging with high C-rates. The charged charge at constant current charging process is calculated by the Coulomb count method. 1 C (400 mA), 2 C (800 mA) and 2.5 C (1 A) were used in this experiment. To minimize the capacity fade effect or performance degradation caused by high C-rate charging, the order of the experiment was carried out from the small C-rate (1 C) to a large C-rate (2.5 C). Before each charging with a specific C-rate, the pouch cell was fully discharged following the standard discharge procedure from the manufacturer. Two hours of relaxation time was set between charge and discharge stage for equilibrium. Open circuit voltages were measured for 10 seconds before starting charging. To compare the starting voltage values under conditions with and without ultrasonic waves, ultrasound waves were transmitted 3 seconds after the charge starts under with ultrasound case. In addition, the capacity before and after the entire charging process was measured to check the effect of high current charging and ultrasonic waves on the degradation of the battery. During experiments, the battery cell was put in a water tank to keep constant temperature. Charging performance of pouch cells with ultrasound waves was improved in high C-rates as shown in FIG. 7.

Figure 7:
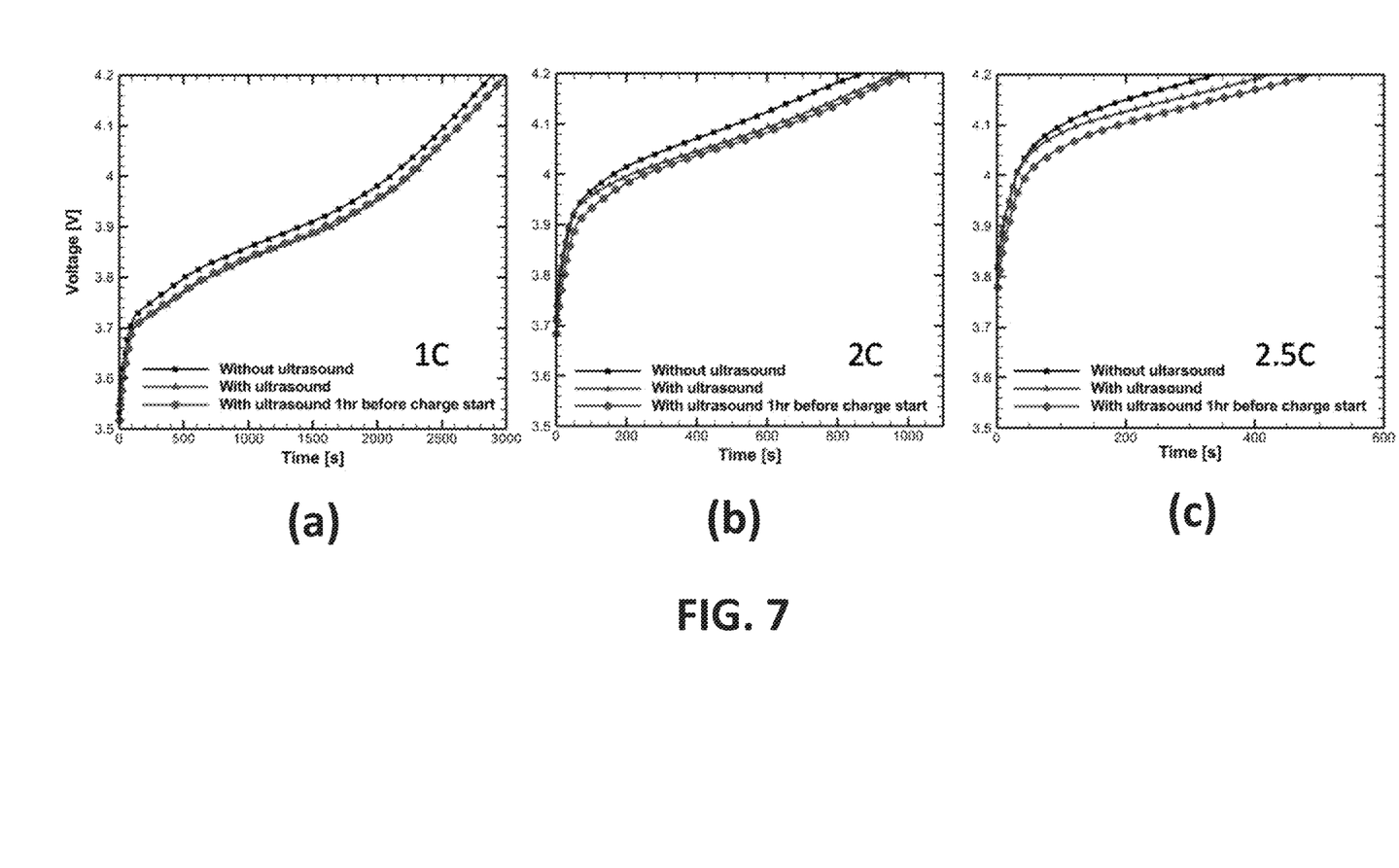
FIG. 7 depicts graphical plots of data for experimentally measured voltage over time for a battery cell being charged in three different charge rates in accordance with one example.

FIG. 7 illustrates three time-voltage graphs of a lithium-ion pouch cell being charged with three different C-rates (1 C, 2 C, and 2.5 C). FIG. 7 (a) illustrates the pouch cell charging with the 1 C rate. FIG. 7 (b) illustrates the pouch cell charging with the 2 C rate. FIG. 7 (c) illustrates the pouch cell charging with the 2.5 C rate. Each graph of FIG. 7 contains three states depending on whether ultrasound waves are present or not. The first line has a meaning of charging with a certain C-rate without an ultrasound case. The second line is with ultrasound from the start of charging. The third line indicates that with ultrasound waves from one hour before starting the charging process.

As shown in FIG. 7, the effect of ultrasound waves in 1 C has little effect, but in 2 C and 2.5 C cases, the charging time increased by about 11% in the 2 C case (from 872 s to 970 s) and 25% in the 2.5 C case (from 341 s to 425 s). Even for the pouch cell that started charging with a 2.5 C-rate, after an hour of exposure to ultrasound the charging time was extended to 491 seconds. This is an improvement of 44% over the existing charging time, and an increase in charging time means an increase in charge capacity. Calculating a charged pouch cell by discharging it with standard discharge procedure, one can see that it charges 34.5% of the pouch cell's nominal capacity 400 mAh at 138 mAh. Charging with high C-rates typically involves high mass transport of lithium ions, which lead to repeated formation of lithium dendrite growth and SEI layers, also contributing to accelerated capacity fading and decreased charging efficiency. However, ultrasound waves can help overcome these difficulties. In addition, the capacity of the pouch cell measured before and after the charging process of high C-rates using ultrasonic waves did not change much. The capacity measurement before the charging process was 448.4 mAh, and the capacity measurement after the charging process was 449.1 mAh. This confirms that the use of ultrasonic waves during the high C-rates charging process does not degrade battery performance.

Reversibility of Ultrasound Effect: Based on the experimental results, it is proposed that a microjet from a cavitation bubble induced by ultrasound waves may remove the SEI layers on electrodes and enhance the transport inside the electrolyte which reduces the impedance of the pouch cell. It is important to improve the performance of pouch cells through ultrasound waves; however, it is also important to determine whether the performance improvement using ultrasound waves radiation is temporary or permanent, or if pouch cell performance degradation does not occur after ultrasound waves transmission. To verify the reversibility of the ultrasound waves effect on the pouch cell performance, EIS measurements were performed after the ultrasound waves turned off at two different levels of SoC.

Figure 8:
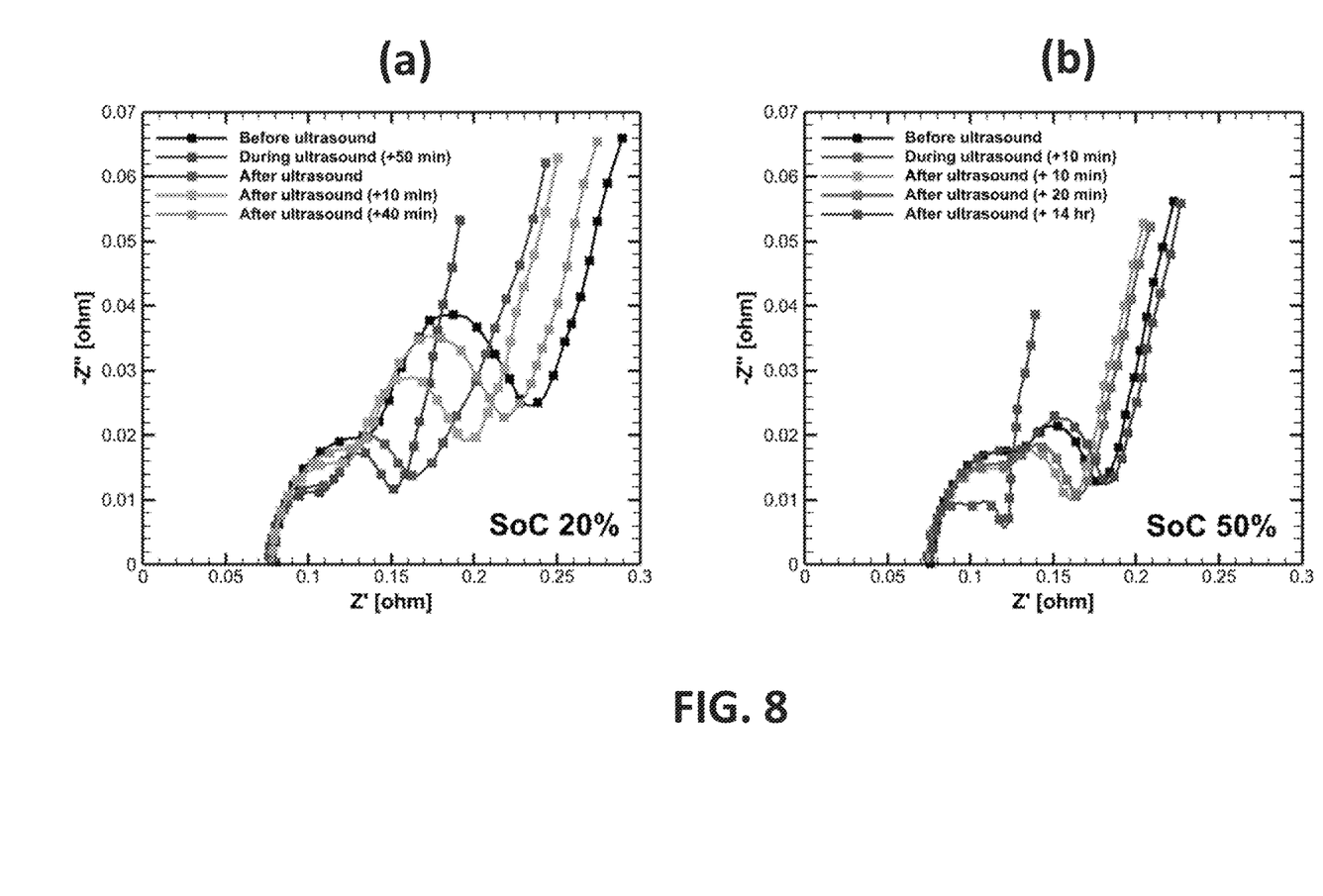
FIG. 8 depicts graphical plots of data for the reversibility of experimentally measured impedance spectroscopy for a battery cell in two different levels of state of charge in accordance with one example.

FIG. 8 shows the impedance measurement of 50% and 20% level of SoC before, during, and after the ultrasound. FIG. 8 (a) illustrates the pouch cell in a state of 20% level of SoC. FIG. 8 (b) illustrates the pouch cell in a state of 50% level of SoC. Because each measurement takes 10 minutes, each curve has a 10-minute interval. 'After ultrasound' is measured over time after ultrasound waves were turned off, and 'during ultrasound' was included to check the degree of recovery of impedance. In both figures, the impedance can be seen to recover to the before ultrasound state after the ultrasound waves were turned off. As soon as the ultrasound waves were turned off, the first thing to be affected was the diffusion impedance part, which can be confirmed by a decrease in the slope of the lower frequency portion (right side of the graph). Over time the SEI layer and the charge transfer impedance part may also increase, and it can be seen that the impedance was recovered to the before the ultrasound waves state. The recovery speed of impedance varies depending on the SoC level, therefore the time required to return to the before ultrasound state also varies. The SEI layer, which had been removed through a microjet generated by the cavitation bubble from ultrasound waves, was regenerated after the ultrasound was turned off. This regenerating layer caused the consumption of recyclable lithium-ion in the electrode/electrolyte interface and was one of the causes of capacity loss of LIBs. Given that the capacity values measured before and after charging using the high C-rate were constant, it can be determined that the organic or inorganic electrolyte decomposition materials previously deposited on the SEI layer to form the SEI layer were decomposed into lithium-ions and can be used again in the charging and discharging process.

In addition to changes in internal impedance values through EIS measurements, changes in capacity were measured to ensure that ultrasound waves affect the capacity of the pouch cells. Table 1 below shows the continuous charging with 2.5 C-rate (1000 mA) and corresponding changes in capacity. Ultrasound waves were applied to some cases, and the pouch cell followed the constant current constant voltage (CC-CV) charging procedure for full charging and constant current (CC) discharging process to calculate the capacity. Whether ultrasound waves were transmitted or not, the capacity of the pouch cell decreased uniformly because of the high C-rate charging. The reason why the measurement of capacity change of this CC-CV charging method differs from the change in capacity before and after the previous CC charging method is that the high current was applied in a relatively short period of time (within 10 minutes), but this CC-CV charging method caused internal degradation of pouch cell because the higher current than 1 C was applied for more than 50 minutes. Especially in the first and second cases, ultrasound waves were only transmitted to the constant current phase of the entire CC-CV charging process, and in the last case, ultrasonic waves were transmitted to the entire charging process. Through these three cases, it can be confirmed that the time of ultrasound waves and the amount of capacity loss are not related to each other. This shows that only a high C-rate charging for more than a certain period of time affects the capacity reduction of the pouch cell, and ultrasound waves only affect the performance of the pouch cell when ultrasound waves are applied.

TABLE 1

Capacity change in continuous charging with high C-rate.

| C-rate | Capacity(mAh) | Change(mAh) | Ultrasound |
|---|---|---|---|
| 2.5 | 414.13 | — | CC stage |
| 2.5 | 397.12 | −17.01 | CC stage |
| 2.5 | 380.70 | −16.42 | — |
| 2.5 | 364.59 | −16.11 | — |
| 0.2 | 371.80 | +7.21 | — |
| 2.5 | 354.22 | −17.58 | CC-CV stage |

As shown above, exposing a commercial battery cell with liquid electrolyte to an ultrasonic field dramatically decreases the impedance of the battery cell and increases the charging capacity with high charging rates. Ultrasound transmitted to the battery creates a microjet by creating a cavitation effect inside the electrolyte between the electrodes, which either reduces the SEI layer generated on the electrodes or enhances the motion of the internal material, thereby reducing internal impedance and enhancing the battery life. Therefore, ultrasound-enabled batteries are the pathway towards fast charging and rejuvenating aged batteries. While the disclosed embodiments may decrease certain efficiencies, such as the overall energy efficiency of charging a battery (since ultrasound fields require more energy), the charging time is much faster, which is a highly sought after and in-demand feature of batteries, particularly in the electric vehicle market.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:
1. A system comprising:
a battery cell in which a liquid electrolyte is disposed; and an acoustic transducer in mechanical communication with the battery cell, the acoustic transducer being configured to generate acoustic waves during a charging or non-charging state of the battery cell;
wherein the acoustic waves have a wavelength larger than a dimension of the battery cell such that the acoustic waves generate cavitation bubbles in the electrolyte.

2. The system of claim 1, wherein the acoustic waves comprise ultrasonic waves.

3. The system of claim 1, wherein the acoustic transducer generates acoustic waves at a predetermined frequency between 20 kHz and 10 MHz.

4. The system of claim 1, wherein the acoustic transducer is positioned relative to the battery cell such that the acoustic waves are bulk acoustic waves.

5. The system of claim 1, wherein:
the battery cell comprises an electrode; and
the acoustic transducer is positioned such that microjets arising from the cavitation bubbles are directed toward the electrode.

6. The system of claim 1, further comprising a battery pack, wherein:
the battery cell is one of a plurality of battery cells of the battery pack; and
the battery pack is pre-stressed such that the acoustic waves propagate throughout the plurality of battery cells.

7. The system of claim 1, wherein the battery cell is configured as a lithium-ion battery.

8. The system of claim 1, wherein the battery cell comprises a prismatic pouch cell, the prismatic pouch cell comprising a plurality of layers, each layer of the plurality of layers including an anode, a cathode spaced apart from the anode, an electrolyte disposed between the anode and the cathode, and a separator disposed within the electrolyte between the anode and the cathode.

9. The system of claim 8, wherein the plurality of layers is disposed within the prismatic pouch cell in a jelly roll configuration.

10. The system of claim 1, wherein the acoustic transducer comprises a piezoelectric transducer.

11. A method of managing a battery, the battery comprising a cell that includes an electrode and a liquid electrolyte disposed within the cell of the battery, the method comprising:
detecting a charging operation of the battery; and
applying, with an acoustic transducer in mechanical communication with the cell of the battery, acoustic waves to the cell of the battery, the acoustic waves being applied during the charging operation of the battery,
wherein the acoustic waves have a wavelength larger than a dimension of the cell of the battery such that the acoustic waves generate cavitation bubbles in the electrolyte disposed within the cell of the battery.

12. The method of claim 11, wherein a collapse of the cavitation bubbles causes a formation of high speed and high pressure microjets, the microjets being perpendicular to a surface of the electrode.

13. The method of claim 12, wherein the microjets reduce a thickness of a layer on the surface of the electrode, such that an impedance of the battery is reduced allowing for fast charging of the battery.

14. The method of claim 13, wherein the reduction of the thickness of the layer on the surface of the electrode minimizes a degradation effect of the battery.

15. The method of claim 14, wherein the degradation effect comprises dendrite formation.

16. The method of claim 12, wherein the microjets enhance the transport of materials inside the electrolyte, such that an impedance of the battery is reduced allowing for fast charging of the battery.

17. A system for reducing an impedance of a battery cell during a charging state of the battery cell, the battery cell comprising an electrode and a liquid electrolyte disposed within the battery cell, the system comprising:
a battery pack, wherein the battery cell is one of a plurality of battery cells of the battery pack; and
an acoustic transducer in mechanical communication with the battery pack, the acoustic transducer being configured to generate, during the charging state of the battery cell, bulk acoustic waves that propagate throughout the plurality of battery cells, wherein the bulk acoustic waves generate cavitation bubbles in the liquid electrolyte disposed within the battery cell,
wherein a collapse of the cavitation bubbles produces high speed and high pressure microjets perpendicular to a formation on a surface of the electrode, such that a size of the formation is reduced by the microjets contacting the formation.

18. The system of claim 17, wherein a frequency range of the bulk acoustic waves is predetermined, such that an effect of the microjets on the formation of the surface of the electrode is maximized and damage to the battery cell, the battery pack, the electrode, or combinations thereof, is minimized.

19. The system of claim 18, wherein sizes of the cavitation bubbles are based on the frequency range of the bulk acoustic waves.

* * * * *